United States Patent
Lindemann et al.

(10) Patent No.: US 10,855,310 B2
(45) Date of Patent: Dec. 1, 2020

(54) DATA TRANSLATION SYSTEM AND METHOD COMPRISING AN OPTOCOUPLER TRANSMISSION SYSTEM WITH A CONTROLLER TO DETERMINE TRANSMISSION COMMUNICATION BETWEEN DEVICES

(71) Applicant: Micro Motion, Inc., Boulder, CO (US)

(72) Inventors: Stig Lindemann, Aarhus (DK); Mads Kolding Nielsen, Hovedgaard (DK)

(73) Assignee: Micro Motion, Inc., Boulder, CO (US)

( * ) Notice: Subject to any disclaimer, the term of this patent is extended or adjusted under 35 U.S.C. 154(b) by 135 days.

(21) Appl. No.: 16/265,247

(22) Filed: Feb. 1, 2019

(65) Prior Publication Data
US 2019/0165805 A1 May 30, 2019

Related U.S. Application Data

(62) Division of application No. 13/054,152, filed as application No. PCT/US2008/071650 on Jul. 30, 2008, now abandoned.

(51) Int. Cl.
*H03M 1/08* (2006.01)
*H03M 7/50* (2006.01)
(Continued)

(52) U.S. Cl.
CPC ........... *H03M 7/50* (2013.01); *H03M 1/0827* (2013.01); *H04B 10/802* (2013.01); *H03M 1/1235* (2013.01)

(58) Field of Classification Search
CPC ...... H03M 1/0827; H03M 7/50; H04B 10/802
(Continued)

(56) References Cited

U.S. PATENT DOCUMENTS

| | | |
|---|---|---|
| 3,949,299 A | 4/1976 | Song |
| 4,037,226 A | 7/1977 | Betts |
| | (Continued) | |

FOREIGN PATENT DOCUMENTS

| | | |
|---|---|---|
| CN | 101151788 A | 3/2008 |
| EP | 0066180 A2 | 12/1982 |
| | (Continued) | |

OTHER PUBLICATIONS

Brokish et al. A-Law and mu-Law Companding Implementations Using the TMS320C54x, Application Note: SPRA163A, Texas Instruments Dec. 1997.
(Continued)

*Primary Examiner* — Que Tan Le
(74) *Attorney, Agent, or Firm* — The Ollila Law Group LLC (57) ABSTRACT

A data translation system (100) for performing a non-linear data translation on a digitized AC signal is provided. The non-linear data translation system (100) includes an input for receiving the digitized AC signal, an output for outputting a non-linearly translated signal, and a processing system (104) coupled to the input and to the output. The processing system (104) is configured to receive the digitized AC signal, non-linearly translate the digitized AC signal using a predetermined transfer function to create the non-linearly translated signal, and transfer the non-linearly translated signal to the output.

10 Claims, 11 Drawing Sheets

(51) Int. Cl.
*H04B 10/80* (2013.01)
*H03M 1/12* (2006.01)

(58) Field of Classification Search
USPC ............................................. 250/551, 214 R
See application file for complete search history.

(56) References Cited

U.S. PATENT DOCUMENTS

| | | | |
|---|---|---|---|
| 4,288,873 A | 9/1981 | Gingell | |
| 4,295,223 A | 10/1981 | Shutterly | |
| 4,393,367 A | 7/1983 | Maruta et al. | |
| 4,550,425 A | 10/1985 | Andersen et al. | |
| 5,652,782 A | 7/1997 | Hughes-Hartogs | |
| 5,668,923 A | 9/1997 | Siwiak et al. | |
| 5,760,730 A | 6/1998 | Fischer et al. | |
| 6,618,700 B1 | 9/2003 | Thyssen et al. | |
| 7,359,604 B2 | 4/2008 | Onde et al. | |
| 7,602,320 B2 | 10/2009 | Klein et al. | |
| 9,012,826 B2 * | 4/2015 | Wong .................. | G01J 1/4257 250/201.1 |
| 2003/0161637 A1 | 8/2003 | Yamamoto et al. | |
| 2004/0189498 A1 | 9/2004 | Takahashi | |
| 2004/0261120 A1 | 12/2004 | Zhang et al. | |
| 2005/0069326 A1 | 3/2005 | Onde et al. | |
| 2006/0250290 A1 | 11/2006 | Lauritzen et al. | |
| 2008/0198048 A1 | 8/2008 | Klein et al. | |

FOREIGN PATENT DOCUMENTS

| | | |
|---|---|---|
| EP | 0821502 A2 | 1/1998 |
| JP | 56156039 A | 12/1981 |
| JP | 1093437 A | 4/1989 |
| JP | 5138943 A | 6/1993 |
| JP | 2004281036 A | 10/2004 |
| RU | 2143179 C1 | 12/1999 |

OTHER PUBLICATIONS

Giblisco, EBSCO Inc. Illustrated Dictionary of Electronics, 2001, pp. 305, 689 retrieved from Internet via USPTO STIC http://www.netlibrary.com/urlapi.asp?action=summary&v=1&bookid=65975.

* cited by examiner

DATA TRANSLATION SYSTEM AND METHOD COMPRISING AN OPTOCOUPLER TRANSMISSION SYSTEM WITH A CONTROLLER TO DETERMINE TRANSMISSION COMMUNICATION BETWEEN DEVICES

CROSS-REFERENCE TO RELATED APPLICATIONS

This patent application is a Divisional Application of and claims the benefit U.S. patent application Ser. No. 13/054,152, filed on Jan. 14, 2011, entitled "DATA TRANSLATION SYSTEM AND METHOD," which is the National Stage entry of International Application No. PCT/US2008/071650, with an international filing date of Jul. 30, 2008, entitled "DATA TRANSLATION SYSTEM AND METHOD," and the contents of both applications are hereby incorporated by reference in their entirety.

BACKGROUND OF THE INVENTION

1. Field of the Invention

The present invention relates to a data translation system and method, and more particularly, to a data translation system and method for performing a non-linear data translation.

2. Statement of the Problem

An optocoupler is a device that communicates signals from a first device to a second device using light. The optocoupler therefore can be used to provide electrical isolation, such as between specific components or circuits. The electrical isolation advantageously can be used to prevent a component or circuit from drawing excessive electrical current. The electrical isolation can further be used to prevent a short-circuit or other problem in a device from affecting other devices. Consequently, an optocoupler is often used for isolating electrical devices and/or electrical circuits.

One isolation application is employed where a device is located within an explosive or hazardous environment. An optocoupler can be used to ensure that the device does not and cannot draw excessive electrical current and therefore cannot create a spark or cause ignition.

An optocoupler has drawbacks. An optocoupler has a relatively slow switching speed. As a result, an optocoupler has a limited signaling bandwidth. Further, an optocoupler is a passive device and does not perform any signal transmission control or regulation.

Aspects of the Invention

In one aspect of the invention, a data translation system for performing a non-linear data translation on a digitized AC signal comprises:
an input for receiving the digitized AC signal;
an output for outputting a non-linearly translated signal; and
a processing system coupled to the input and to the output and configured to receive the digitized AC signal, non-linearly translate the digitized AC signal using a predetermined transfer function to create the non-linearly translated signal, and transfer the non-linearly translated signal to the output.

Preferably, the predetermined transfer function creates the non-linearly translated signal with respect to a predetermined reference point.

Preferably, the predetermined transfer function is configured to alternatively compress or amplify digital values of the digitized AC signal.

Preferably, the predetermined transfer function is configured to alternatively compress or amplify digital values of the digitized AC signal in relation to a distance from the predetermined reference point.

Preferably, the non-linear data translation substantially preserves phase information in the non-linearly translated signal.

Preferably, the non-linear data translation preserves zero-crossing information in the non-linearly translated signal.

Preferably, the non-linear data translation substantially reduces a signal bandwidth of the non-linearly translated signal.

In one aspect of the invention, a data translation method for a digitized AC signal comprises:
receiving the digitized AC signal;
non-linearly translating the digitized AC signal using a predetermined transfer function to create a non-linearly translated signal; and
transferring the non-linearly translated signal.

Preferably, the predetermined transfer function creates the non-linearly translated signal with respect to a predetermined reference point.

Preferably, the predetermined transfer function is configured to alternatively compress or amplify digital values of the digitized AC signal.

Preferably, the predetermined transfer function is configured to alternatively compress or amplify digital values of the digitized AC signal in relation to a distance from the predetermined reference point.

Preferably, the non-linear data translation substantially preserves phase information in the non-linearly translated signal.

Preferably, the non-linear data translation preserves zero-crossing information in the non-linearly translated signal.

Preferably, the non-linear data translation substantially reduces a signal bandwidth of the non-linearly translated signal.

In one aspect of the invention, an optocoupler transmission system for controlling signal transmission through an optocoupler transmission medium comprises:
an optocoupler; and
a controller coupled to the optocoupler and configured to receive a transmit attempt from a first device, determine if a second device is already transmitting through the optocoupler, determine if receiving the transmit attempt is outside a deadband period after a power-up occurrence, and transmit from the first device through the optocoupler if the second device is not transmitting and if the deadband period has elapsed.

Preferably, the controller is further configured to hold off the first device from transmitting through the optocoupler until the second device has completed transmission if the second device is already transmitting.

Preferably, the controller being is configured to hold off the first device from transmitting through the optocoupler until the deadband period has elapsed if the transmit attempt is within the deadband period.

Preferably, the optocoupler transmission system includes at least two devices communicating through the optocoupler.

Preferably, the optocoupler transmission system implements a master-slave communication scheme.

In one aspect of the invention, a transmission control method for controlling signal transmission through an optocoupler transmission medium comprises:

receiving a transmit attempt from a first device;

determining if a second device is already transmitting through the optocoupler transmission medium;

determining if receiving the transmit attempt is outside a deadband period after a power-up occurrence; and transmitting from the first device through the optocoupler transmission medium if the second device is not transmitting and if the deadband period has elapsed.

Preferably, the method further comprises holding off the first device from transmitting through the optocoupler transmission medium until the second device has completed transmission if the second device is already transmitting.

Preferably, the method further comprises holding off the first device from transmitting through the optocoupler transmission medium until the deadband period has elapsed if the transmit attempt is within the deadband period.

Preferably, the optocoupler transmission medium includes at least devices communicating through the optocoupler transmission medium.

Preferably, the method implements a master-slave communication scheme.

DESCRIPTION OF THE DRAWINGS

The same reference number represents the same element on all drawings. It should be understood that the drawings are not necessarily to scale.

DETAILED DESCRIPTION OF THE INVENTION

FIGS. 1-11 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Figure 1:
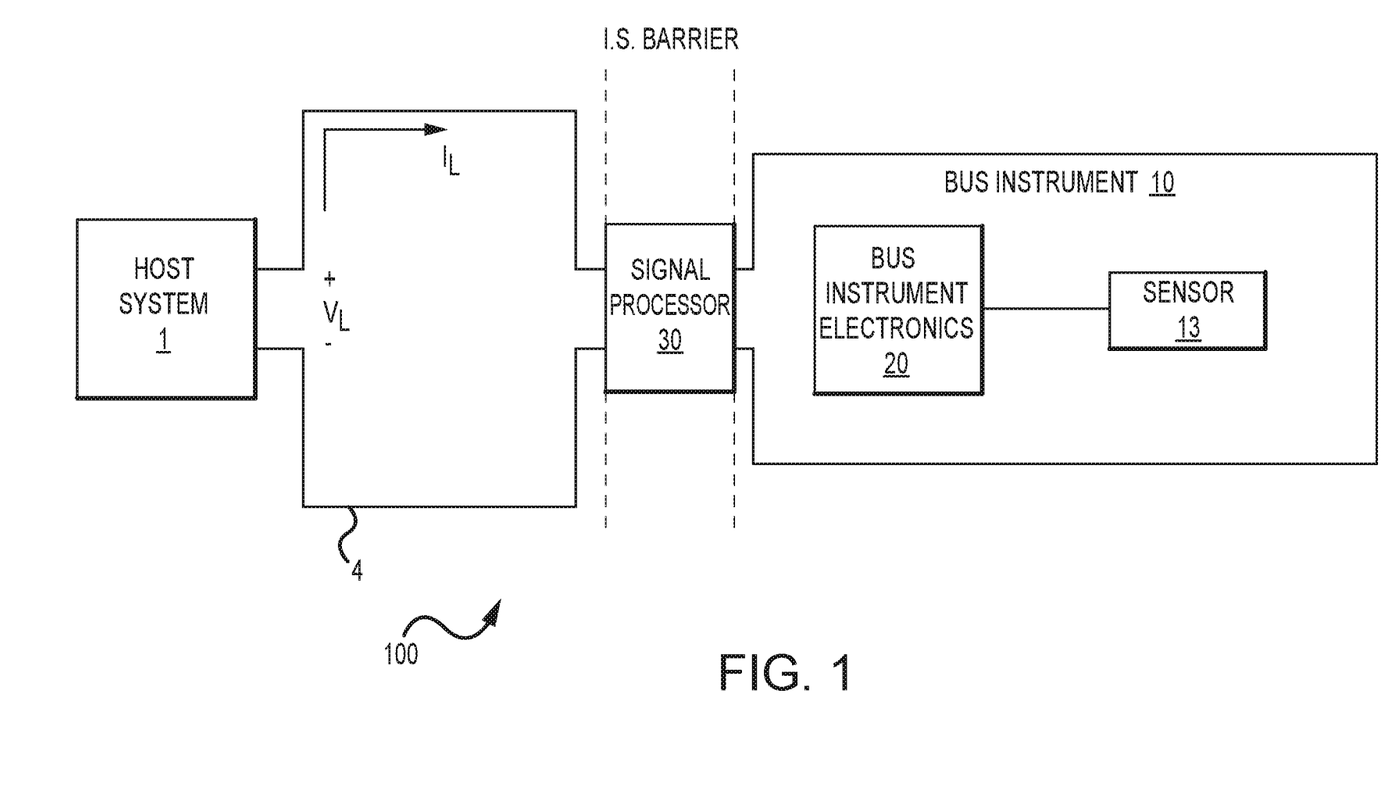
FIG. 1 shows a bus loop system according to an embodiment of the invention.

FIG. 1 shows a bus loop system 100 according to an embodiment of the invention. The bus loop 100 includes a host system 1, a bus loop 4, a bus instrument 10, and a signal processor 30 coupling the bus instrument 10 to the bus loop 4. The host system 1 generates a loop voltage $V_L$ and a loop current $I_L$ over the bus loop 4. The host system 1 may comprise a central control unit, a CPU, or some other processing system used to process the signals received over the bus loop 4. According to one embodiment of the invention, the bus loop 4 comprises a two-wire bus loop 4. However, it should be understood that the bus loop 4 does not have to comprise a two-wire bus loop.

The bus instrument 10 can include any manner of sensor or meter, such as a flow meter. In embodiments where the bus instrument 10 includes a flow meter, the flow meter may comprise a vibratory flow meter, such as a Coriolis flow meter or a densitometer. As shown in FIG. 1, the bus instrument 10 includes a sensor 13 and bus instrument electronics 20. The bus instrument electronics 20 may comprise any manner of CPU, processing system, or microprocessing system. According to an embodiment of the invention, the sensor 13 is configured to generate first analog signals and input the first analog signals to the bus instrument electronics 20. The bus instrument electronics 20 can generate second analog signals that are in the form of a variable loop current $I_L$ flowing in the bus loop 4. The bus instrument 10 can be configured to draw a predetermined or limited amount of power when in use with the two-wire bus 4. Because of the measurement communication protocol and the power limitations built into the bus loop system 100, the bus instrument 10 may be isolated from the two-wire bus loop 4 using a signal processor 30. In some embodiments, the signal processor 30 can comprise an intrinsically safe (I.S.) barrier (dashed line).

The isolation limits the electrical power that the bus instrument 10 can draw from the two-wire bus loop 4 and the host system 1. The isolation prevents damage to the two-wire bus loop 4 and the host system 1 upon the event of catastrophic failure of the bus instrument 10. In addition, the isolation limits electrical power transfer through the I.S. barrier in order to eliminate an explosion hazard and prevent ignition of any explosive or flammable materials in the environment of the bus instrument 10.

Figure 2:
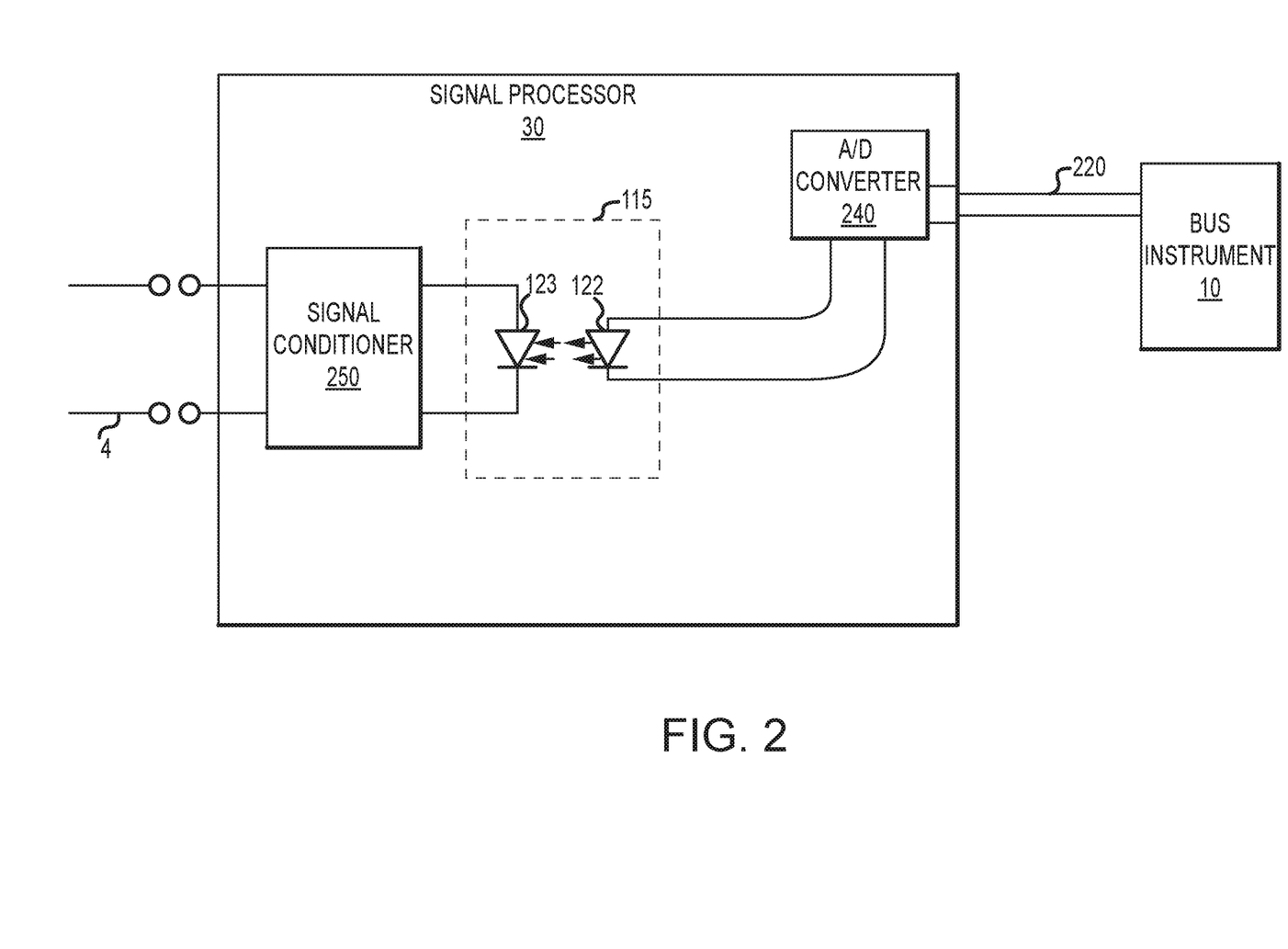
FIG. 2 shows greater detail of an isolation feature of the signal processor according to an embodiment of the invention.

FIG. 2 shows greater details of an isolation feature of the signal processor 30 according to an embodiment of the invention. The signal processor is shown as receiving a first analog signal from the bus instrument 10. However, it should be understood that the first analog signal does not have to originate from the bus instrument 10, but rather, the signal processor 30 may be utilized in other environments where analog signal processing is required. The analog signal received from bus instrument 10 over leads 220 are received by an analog to digital converter 240 where the signals are digitized. According to one embodiment of the invention, the analog-to-digital converter 240 comprises a delta sigma converter, which converts the analog signal into a serial bit stream. However, it should be understood that other analog-to-digital converters may be used and the particular analog-to-digital converter used should not limit the scope of the invention.

According to an embodiment of the invention, the signal processor 30 includes art optocoupler 115 that is connected between the two-wire bus loop 4 and the analog-to-digital converter 240. The optocoupler 115 may also be referred to as an opto-isolator, optical coupler, or photocoupler. The optocoupler 115 electrically isolates the bus instrument 10 from the host system 1. Consequently, the bus instrument 10 cannot short out the two-wire bus loop 4. Furthermore, catastrophic failure of the bus instrument 10 cannot draw excessive current from the host system 1. The optocoupler 115 comprises a transmitter light source 122 and a receiver light source 123. The transmitter and receiver light sources 122, 123 can comprise any manner of light-reactive electronic components, including laser transmitter and receiver light sources, LED transmitter and receiver light sources, LED laser transmitter and receiver light sources, etc.

The transmitter light source 122 and the receiver light source 123 are commonly formed adjacent to each other wherein light generated by the transmitter light source 122 is directly received by the receiver light source 123. In other embodiments, the transmitter light source 122 and the receiver light source 123 are separated by some optical device, such as a fiber optic cable, for example. In some embodiments, the two components are formed into a single package as shown in FIG. 2. However, it should be understood that in other embodiments the transmitter light source 122 and the receiver light source 123 may comprise separate components.

The transmitter light source 122 generates a light-encoded signal that comprises a conversion of electrical current into emitted light. The receiver light source 123 receives the light-encoded signal and converts the received light back into an electrical signal that is substantially identical to the original electrical signal at the transmitter light source 122. The optocoupler 115 is therefore well suited for transferring digital signals.

In the embodiment shown in FIG. 2, the bus instrument 10 generates a first analog signal, which is sent to the analog-to-digital converter 240. The analog-to-digital converter 240 outputs a digital signal. The digital signal is received by the transmitter light source 122 and sent to the receiver light source 123. The receiver light source 123 can then transmit the received signal to a signal conditioner 250.

The signal conditioner 250 can process the digital signals, which may be in the form of a serial bit stream, for example and convert the digital signal into a scaled pulse width modulation (PWM) signal. The PWM signal can then be converted into a second analog signal and output to the bus loop 4.

Figure 3:
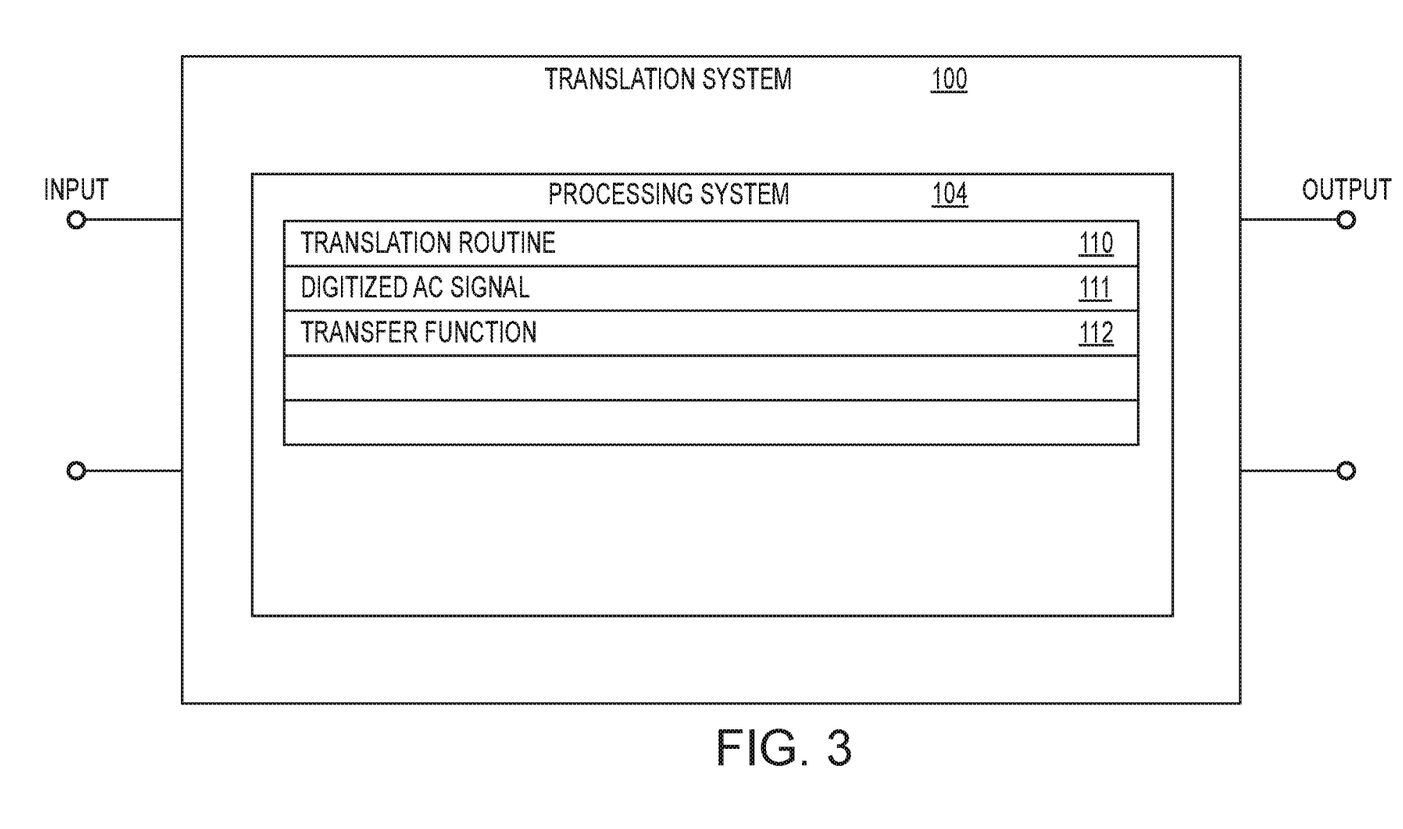
FIG. 3 shows a translation system for performing a data translation on a digitized AC signal according to an embodiment of the invention.

FIG. 3 shows a translation system 100 for performing a non-linear data translation on a digitized AC signal according to an embodiment of the invention. The translation system 100 includes one or more inputs 101 and one or more outputs 102. The translation system 100 receives the digitized AC signal at the input 101 and outputs a translated signal at the output 102. The translated signal can be translated into a form that is more efficient and usable for transmission over a transmission medium, such as transmission through the optocoupler 115, for example. However, other transmission media are contemplated and are within the scope of the description and claims.

The translation system 100 is configured to receive the digitized AC signal, non-linearly translate the digitized AC signal using a predetermined transfer function to create a translated signal portion, and transfer the translated signal portion. The translation system 100 can translate the digitized AC signal with respect to a predetermined reference point. The translation system 100 can translate the digitized AC signal with respect to a distance from the predetermined reference point, such as a vertical distance (i.e., voltage) from the reference point.

The translation system 100 can comprise any manner of system, including a part of the signal processor 30 or other barrier device, an analog-to-digital (A/D) converter, a processor or microprocessor, a pre-processor, etc. Alternatively, in some embodiments the translation system 100 can comprise a portion or subsystem of the bus instrument 10.

The translation system 100 can include a processing system 104 and storage (not shown). The processing system 104 can include a translation routine 110, a digitized AC signal storage 111 (or storage for at least a portion of the digitized. AC signal, such as a signal portion), and a predetermined transfer function 112. The predetermined transfer function 112 is employed to process the digitized AC signal or signal portion thereof and perform the non-linear translation of the signal portion (see discussion below).

Figure 4:
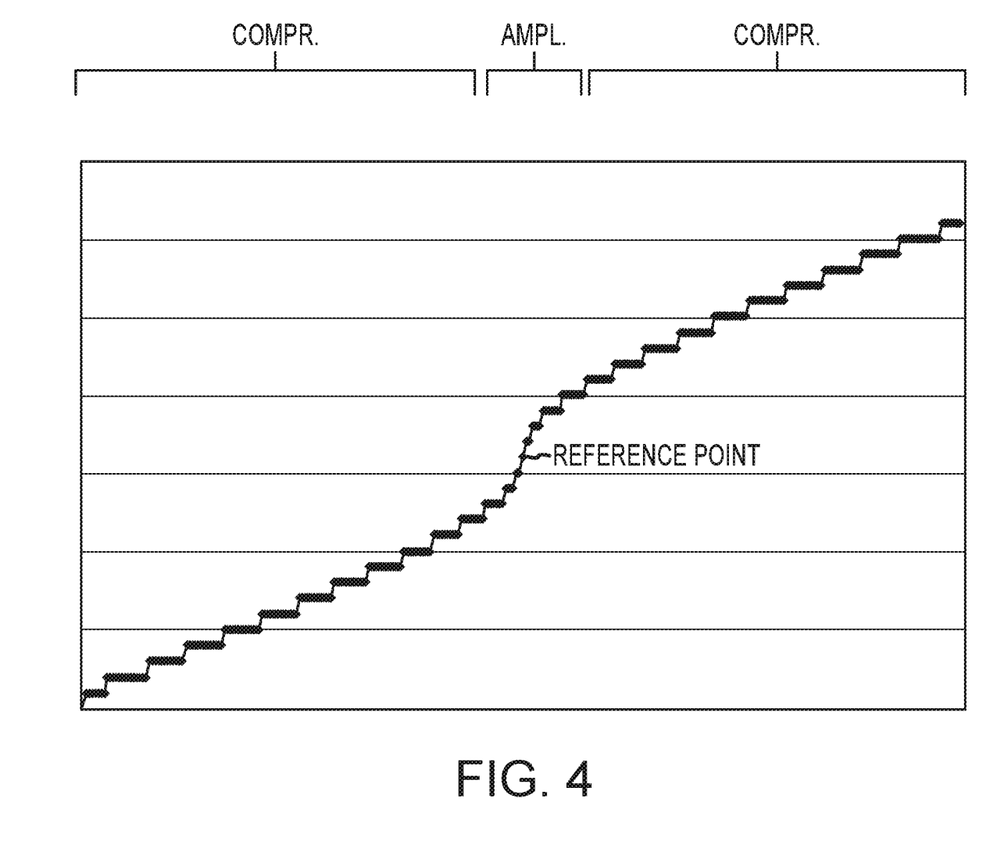
FIG. 4 shows a transfer function according to an embodiment of the invention.

FIG. 4 shows a transfer function according to an embodiment of the invention. The transfer function is non-linear, including both compression and amplification. This is shown in the legends above the graph. Further, in some embodiments the compression and amplification can also be non-linear.

The transfer function modifies the digitized AC signal, such as by adjusting specific values or regions, yet without changing the overall shape of the input waveform. The transfer function can comprise a mathematical function that translates the digitized AC signal. Alternatively, the transfer function can comprise a series of coefficients that are multiplied by the digitized. AC signal, essentially a digital filter. The digitized AC signal is translated in order to improve the transfer of the digitized AC signal and in order to improve the efficiency of the transfer. The data translation enhances transmission by limiting bandwidth. The data translation retains phase information and advantageously retains the phase information while decreasing bandwidth. The data translation achieves this by both compressing and amplifying the digitized AC signal.

In some embodiments, the digitization can comprise a digital communication protocol that is imposed onto a time-varying AC signal, such as on an analog measurement signal. For example, a HART digital communication protocol can be superimposed on an analog voltage or analog current signal. The HART protocol in some embodiments can employ a Continuous Phase Frequency-Shift Keying (CP-FSK) modulation. However, it should be understood that other communication protocols and modulations are contemplated and are within the scope of the description and claims.

The transfer function performs amplification on input values that are within a specified distance of a reference point. One reference point can be an AC signal zero-crossing point, even where the zero-crossing point has been shifted above or below a zero voltage level. However, other reference points are contemplated and are within the scope of the description and claims.

The amplification can achieve a predetermined gain. The amplification can be substantially linear or can be non-linear. In some embodiments, the gain can vary with distance from the reference point. The amplification around the reference point preserves the zero-crossing information. The amplification around the reference point can make zero-crossing discrimination easier.

Conversely, the transfer function performs compression on a signal portion that is more than the predetermined distance from the reference point, such as the previously discussed zero-crossing point. The compression can be substantially linear or can be non-linear. The compression can achieve a predetermined compression. In some embodiments, the compression can vary with a distance from the reference point.

Figure 5:
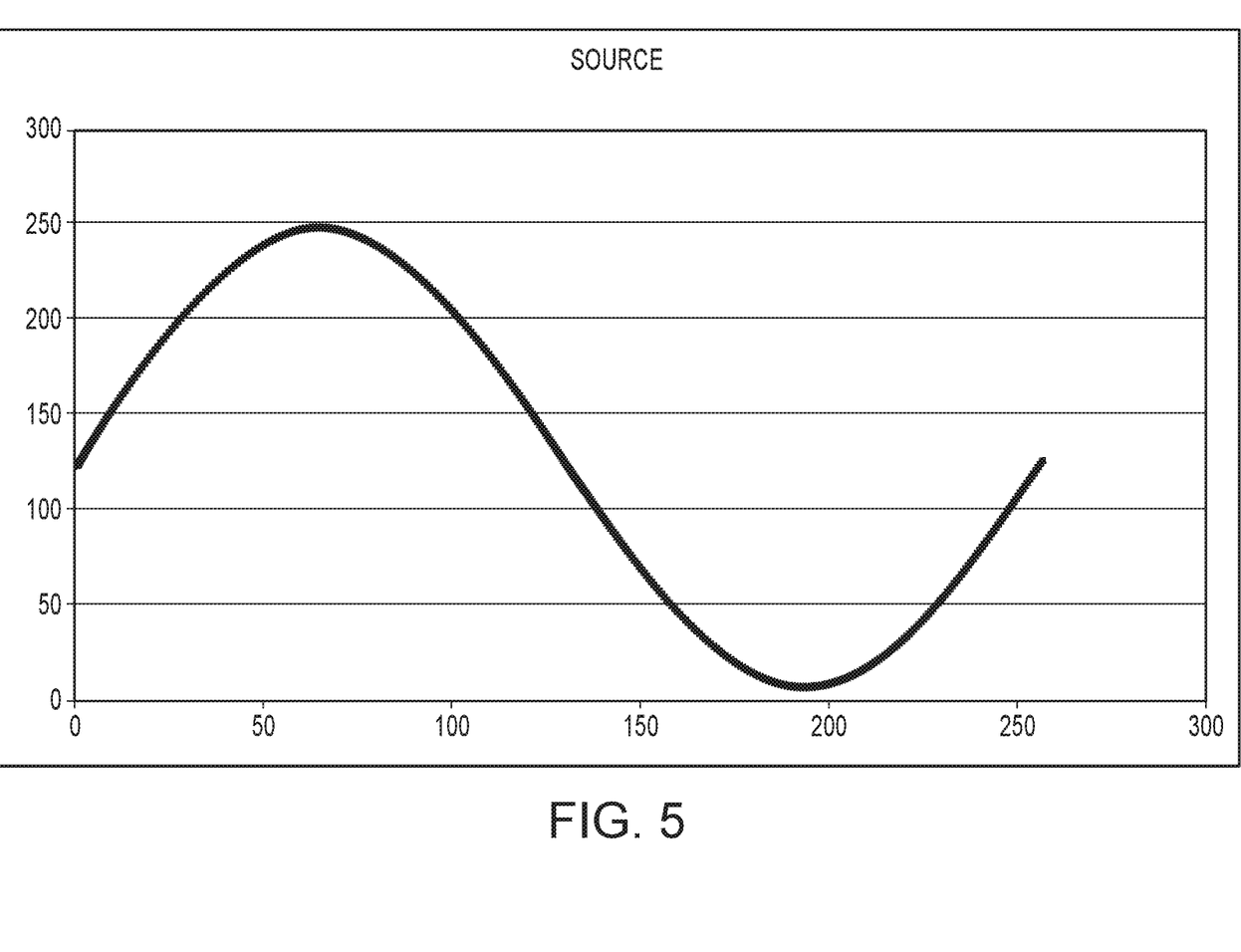
FIG. 5 shows an AC signal at the input of the translation system.

FIG. 5 shows an AC signal at the input of the translation system 100. The AC signal comprises a time-varying signal including an amplitude and period. The AC signal can be already digitized or alternatively in some embodiments can be digitized by the translation system 100 before translation.

Figure 6:
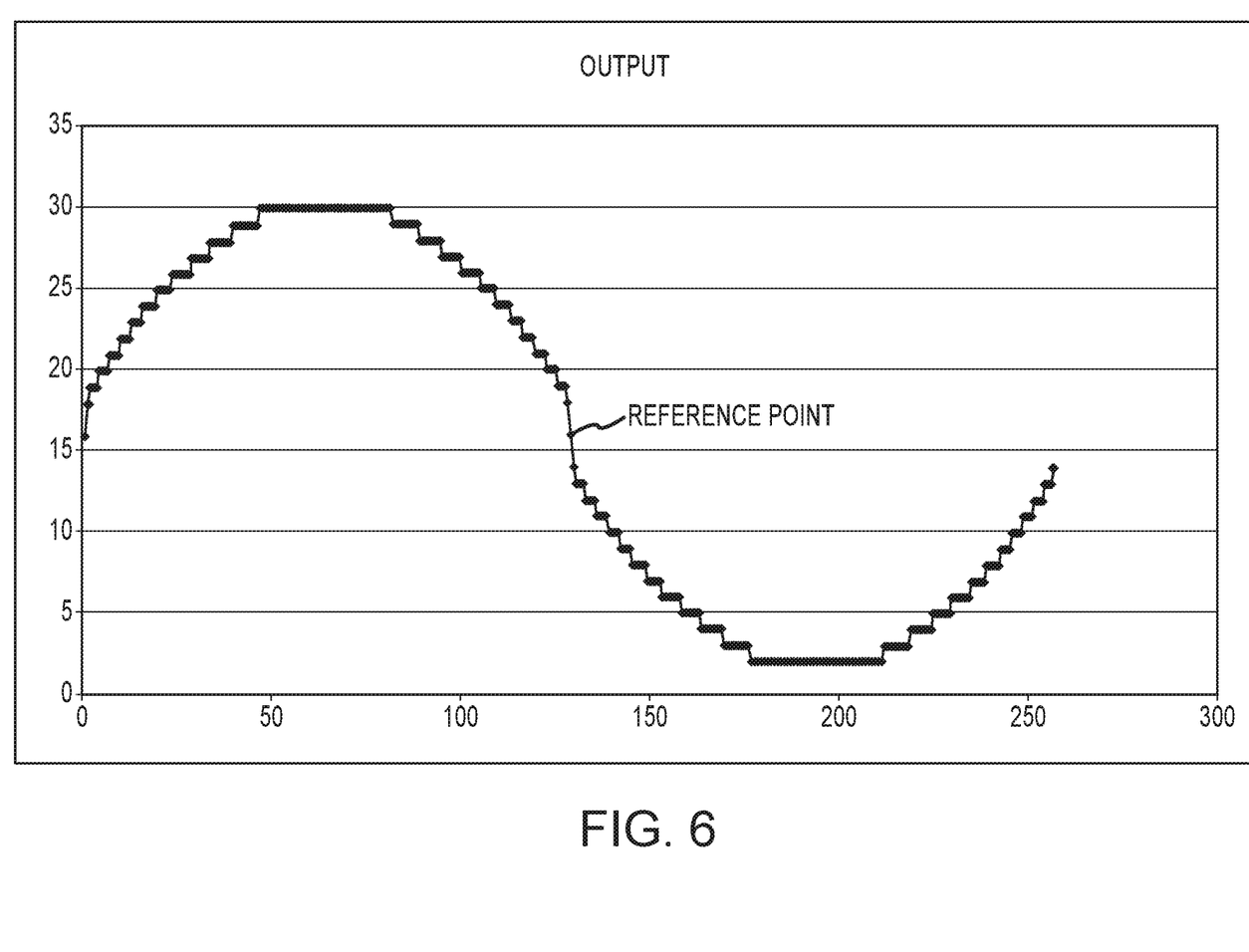
FIG. 6 shows the digitized AC signal after non-linear data translation according to the invention.

FIG. 6 shows the digitized AC signal after non-linear data translation according to the invention. It can be seen from this figure that the overall peak-to-peak amplitude of the AC signal has been significantly reduced and compressed without changing the waveform shape. In this example, the original AC signal has been compressed from an original amplitude of about 250 down to an amplitude of about 30. However, at the same time the amplitude around the reference point, which here is a zero-crossing point (even though the amplitude is not zero), has been amplified. In contrast to the compressed regions where the digital values are about one unit apart vertically, in the amplified region around the reference point the digital values are about three units apart. This is done so that the reference points in the digitized AC signal doe not become closer together and harder to discriminate, such as if the signal regions around the reference point had been compressed. Compressed digital values may be difficult to determine, especially in the presence of noise superimposed onto the digital values.

The end result is that digital values away from the reference point (such as near the peaks) are relatively close in terms of vertical distance as a result of the compression. Conversely, the digital values around the reference point are moved vertically apart by the amplification. The result is that the reference points are easier to discriminate while the overall AC signal requires less overall bandwidth.

Figure 7:
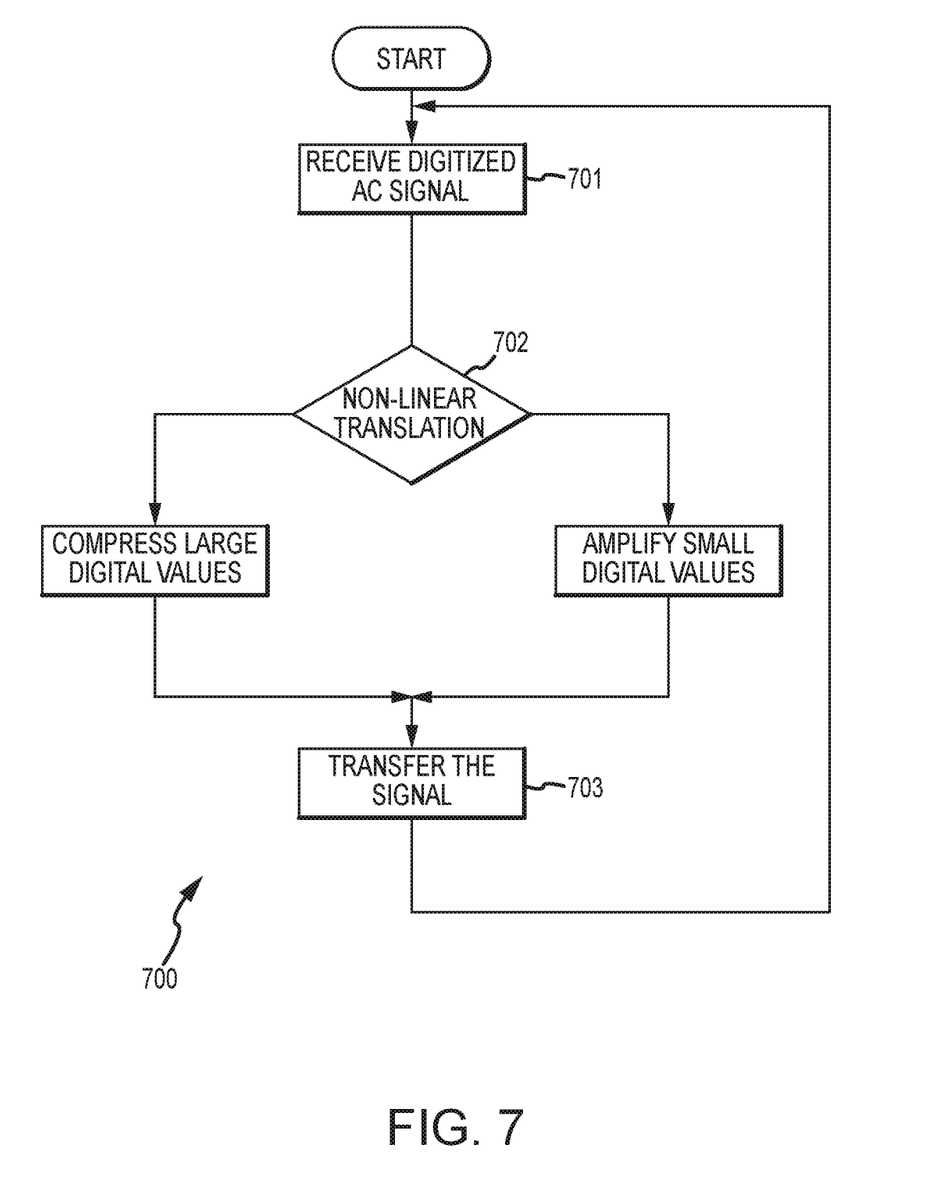
FIG. 7 is a flowchart of a data translation method for a digitized AC signal according to an embodiment of the invention.

FIG. 7 is a flowchart 700 of a data translation method for a digitized AC signal according to an embodiment of the invention. In step 701, the digitized AC signal is received.

In step 702, the digitized AC signal is non-linearly translated. Using the transfer function, the signal away from a reference point is compressed (i.e., large digital values are compressed). The compression can be of any desired amount and can employ any desired compression. The compression of the signal portion in this voltage region operates to reduce the bandwidth of the digitized AC signal and makes the transmission of the digitized AC signal through the optocoupler more efficient. Further using the transfer function, the signal close to the reference point is amplified by a predetermined gain (i.e., small digital values are amplified). The amplification can be by any desired gain amount. The amplification preserves the phase information, including the phase information provided by zero crossings of the digitized AC signal. Further, the amplification can make the zero crossing points easier to discriminate in the digitized AC signal after the digitized AC signal passes through the optocoupler.

In step 703, after the signal portion is compressed/amplified, the non-linearly translated signal is transferred to the optocoupler for transmission. After transmission, the phase information can be determined from the non-linearly translated signal, including the zero-crossing information. Further, if desired, the compression and amplification can optionally be reversed after the transmission, such as by using a mirror-image (i.e., reverse) transfer function. Subsequently, the method can loop back up to step 701 and iteratively receive and process signal portions.

Figure 8:
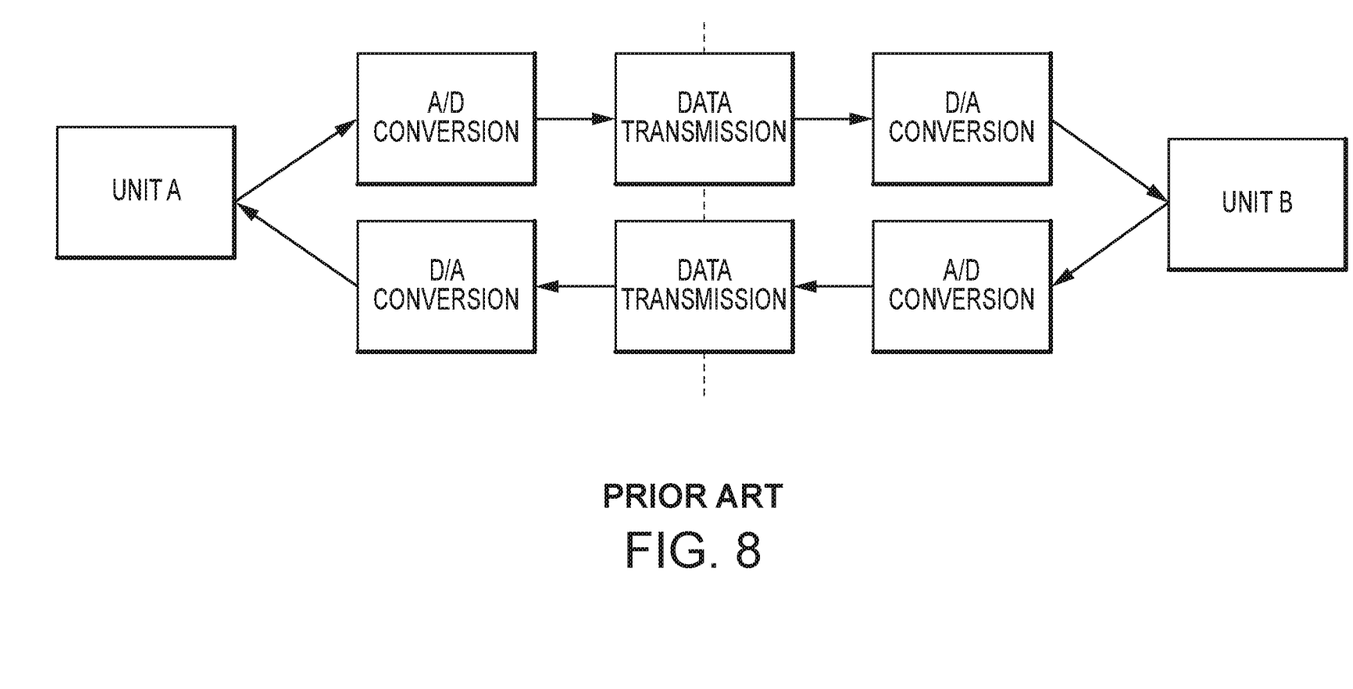
FIG. 8 shows a prior art optocoupler communication system that performs duplex communications through an optocoupler transmission medium between device A and device B.

FIG. 8 shows a prior art optocoupler communication system that performs duplex communications through an optocoupler transmission medium between device A and device B. The optocoupler transmission medium includes an optocoupler and associated wires or other conductors. Two separate transmission paths are included so that duplex communications (i.e., communications in both directions) can be performed. In some embodiments, the communications comprise half-duplex communications wherein only one device can transmit at a time.

The prior art optocoupler communication system has drawbacks. Both device A and device B can attempt to communicate at the same time. Simultaneous communication attempts in a half-duplex communication system will result in a failure of transmission. Further, if a transmission from device A creates an echo back to device A, then device A can misinterpret the received echo as a legitimate transmission from device B.

Figure 9:
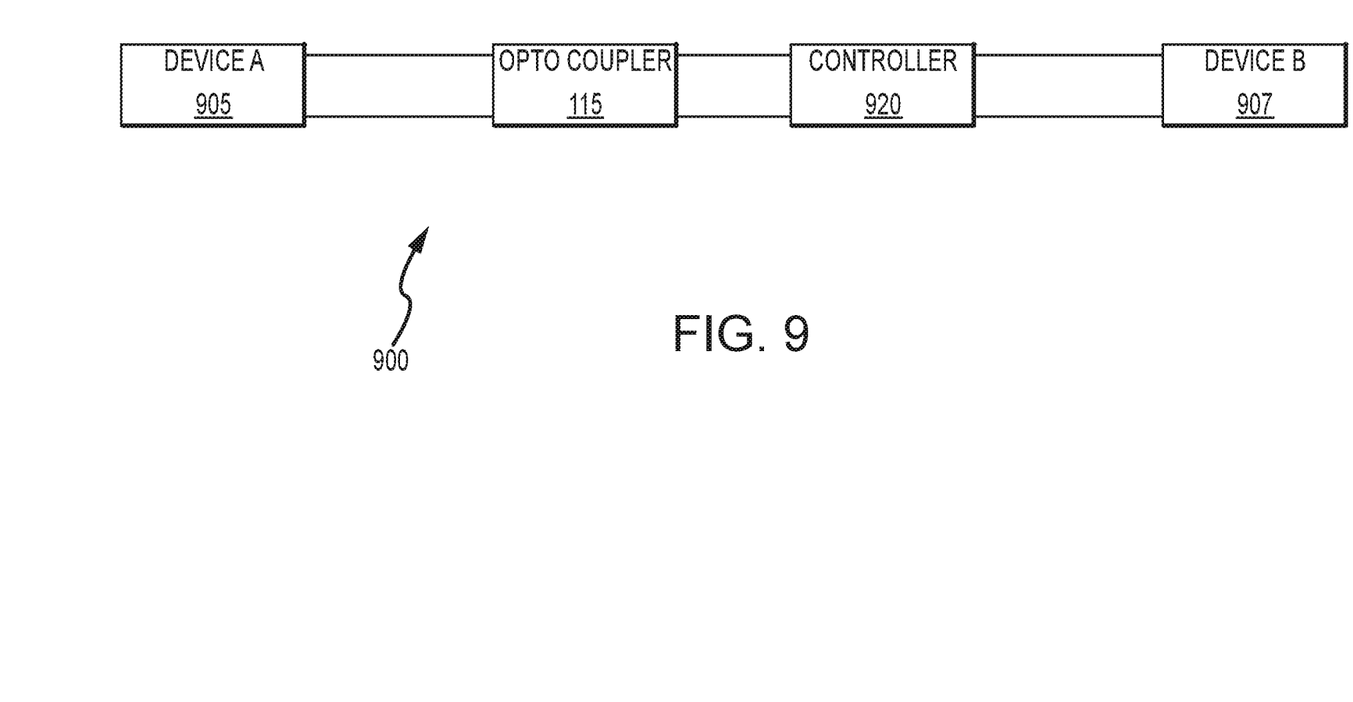
FIG. 9 shows an optocoupler communication system according to an embodiment of the invention.

FIG. 9 shows an optocoupler communication system 900 according to an embodiment of the invention. The optocoupler communication system 900 includes a controller 920 that regulates communications between device A 905 and device B 907 through a transmission medium including the optocoupler 115. The optocoupler 115 in some embodiments performs half-duplex (or simplex) communication between devices, wherein only one device can transmit at a time.

It should be understood that the controller 920 can be located anywhere in the optocoupler communication system 900 and is shown at the right of the optocoupler 115 merely for illustration. In some embodiments, the controller 920 can comprise a component of the signal processor 30. Further, the controller 920 in some embodiments can comprise a component of device A 905 or device B 907, wherein the device operates like a master communication device. At the same time, the other device(s) operates as a slave communication device(s).

The optocoupler communication system 900 is configured to prevent the reception of echoes. Alternatively or in addition, the optocoupler communication system 900 is configured to prevent more than one device from transmitting at a time.

The optocoupler communication system 900 in some embodiments is configured to receive a transmit attempt from a first device A 905, determine if a second device B 907 is already transmitting through the optocoupler 115, determine if receiving the transmit attempt is outside a deadband period after a power-up occurrence, and transmit from the first device A 905 through the optocoupler 115 if the second device B 907 is not transmitting and if the deadband period has elapsed.

Figure 10:
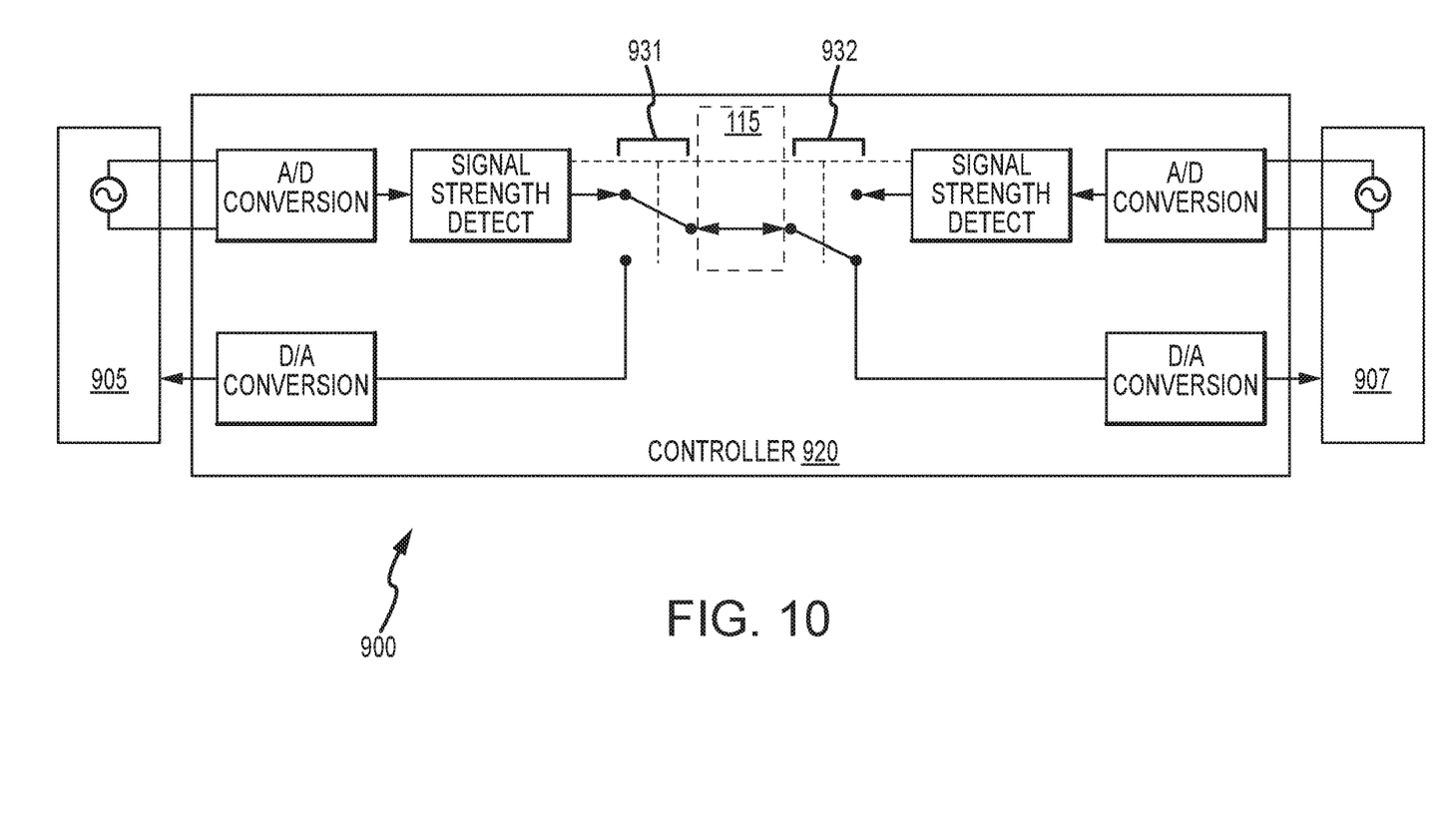
FIG. 10 shows further detail of the optocoupler communication system according to an embodiment of the invention.

FIG. 10 shows further detail of the optocoupler communication system 900 according to an embodiment of the invention. In this embodiment, the controller 920 and the optocoupler 115 are combined into one device. The combined device can include additional capabilities and additional circuitry. The controller 920 can include switches 931 and 932 that are switched by the controller 920 in order to regulate transmission through the optocoupler 115. The switches can comprise any manner of switches.

Figure 11:
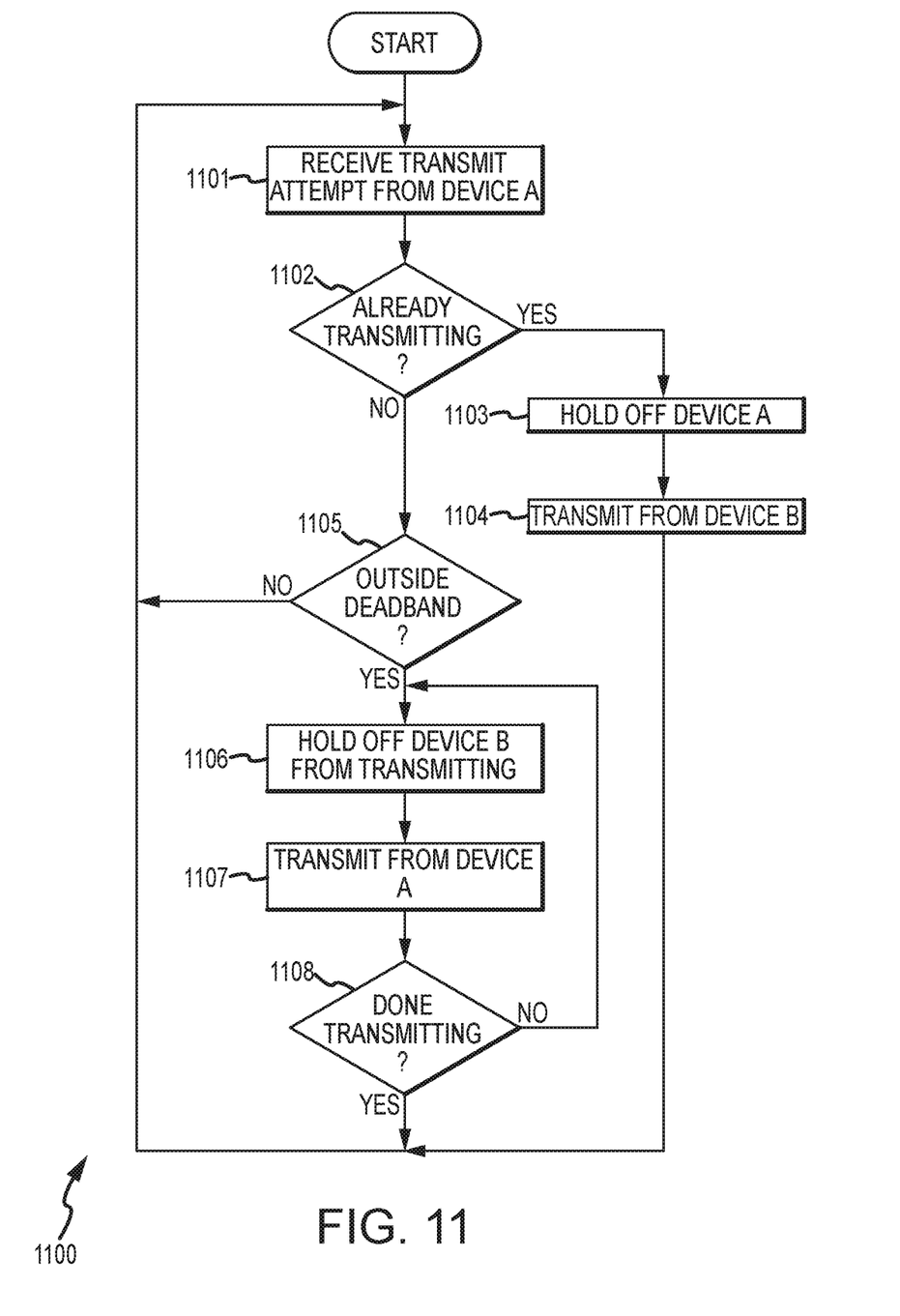
FIG. 11 is a flowchart of a transmission control method for controlling signal transmission through an optocoupler transmission medium according to an embodiment of the invention.

FIG. 11 is a flowchart 1100 of a transmission control method for controlling signal transmission through an optocoupler transmission medium according to an embodiment of the invention. In step 1101, a transmit attempt is received from a device such as device A. It should be understood that the transmit attempt can be from any device, but device A is used in this figure and example for purposes of clarity.

In step 1102, it is determined whether device B is already transmitting. If device B is already transmitting, then the method proceeds to step 1103. If device B is not already transmitting, then the method branches to step 1105.

In step 1103, where device B is already transmitting, device A is held off from transmitting. The holding off is done until device B has completed transmitting.

In step 1104, the method holds off other transmission attempts until the transmission from device B is complete. The transmission can comprise a transmission from device B to device A in some embodiments, although other devices are contemplated and are within the scope of the description and claims.

In step 1105, where device B was not already transmitting, the method checks to see if the attempt is outside of a deadband. If the transmit attempt is not outside of the deadband, then the method loops back up to step 1101 and all transmissions are held off until the deadband period has elapsed. If instead the transmit attempt is outside the deadband, then the method proceeds to step 1106.

For some bus instruments, during a power-up phase the instrument may generate and put out measurements or other data that are not within specifications and should not be transmitted. For this reason, the method can implement a deadband period for a predetermined time after power-up. Signals received during this deadband period can be judged unreliable and can be ignored. Signals arriving after the deadband has expired are judged acceptable.

In step 1106, device B is held off from transmitting. This can include additional devices if more that two devices can transmit through the optocoupler transmission medium.

In step 1107, device A is allowed to transmit.

In step 1108, the method checks to see if device A is done transmitting. If device A is not done transmitting, the method loops back to step 1106. If (and when) device A is done transmitting, then the method loops back up to step 1101 and waits for further transmit attempts.

What is claimed is:

1. An optocoupler transmission system (900) for controlling signal transmission through an optocoupler transmission medium, the optocoupler transmission system (900) comprising:
   an optocoupler (115); and
   a controller (920) coupled to the optocoupler (115) and configured to receive a transmit attempt from a first device (905), determine if a second device (907) is already transmitting through the optocoupler (115), determine if receiving the transmit attempt is outside a deadband period after a power-up occurrence, and transmit from the first device (905) through the optocoupler (115) if the second device (907) is not transmitting and if the deadband period has elapsed.

2. The optocoupler transmission system (900) of claim 1, with the controller (920) being further configured to hold off the first device (905) from transmitting through the optocoupler (115) until the second device (907) has completed transmission if the second device (907) is already transmitting.

3. The optocoupler transmission system (900) of claim 1, with the controller (920) being further configured to hold off the first device (905) from transmitting through the optocoupler (115) until the deadband period has elapsed if the transmit attempt is within the deadband period.

4. The optocoupler transmission system (900) of claim 1, wherein the optocoupler transmission system (900) includes at least two devices (905, 907) communicating through the optocoupler (115).

5. The optocoupler transmission system (900) of claim 1, wherein the optocoupler transmission system (900) implements a master-slave communication scheme.

6. A transmission control method for controlling signal transmission through an optocoupler transmission medium, the method comprising:
   receiving a transmit attempt from a first device;
   determining if a second device is already transmitting through the optocoupler transmission medium;
   determining if receiving the transmit attempt is outside a deadband period after a power-up occurrence; and
   transmitting from the first device through the optocoupler transmission medium if the second device is not transmitting and if the deadband period has elapsed.

7. The method of claim 6, further comprising holding off the first device from transmitting through the optocoupler transmission medium until the second device has completed transmission if the second device is already transmitting.

8. The method of claim 6, further comprising holding off the first device from transmitting through the optocoupler transmission medium until the deadband period has elapsed if the transmit attempt is within the deadband period.

9. The method of claim 6, wherein the optocoupler transmission medium includes at least two devices communicating through the optocoupler transmission medium.

10. The method of claim 6, wherein the method implements a master-slave communication scheme.

* * * * *

UNITED STATES PATENT AND TRADEMARK OFFICE
CERTIFICATE OF CORRECTION

PATENT NO. : 10,855,310 B2  
APPLICATION NO. : 16/265247  
DATED : December 1, 2020  
INVENTOR(S) : Stig Lindemann and Mads Kolding Nielsen Page 1 of 1

It is certified that error appears in the above-identified patent and that said Letters Patent is hereby corrected as shown below:

In the Specification

Column 3, Line 21, replace "at least devices" with --at least two devices--.

Column 5, Line 5, replace "includes art optocoupler" with --includes an optocoupler--.

Column 6, Lines 19 and 36, replace "digitized. AC signal" with --digitized AC signal--.

Signed and Sealed this  
Twenty-fourth Day of August, 2021

Drew Hirshfeld  
*Performing the Functions and Duties of the*  
*Under Secretary of Commerce for Intellectual Property and*  
*Director of the United States Patent and Trademark Office*